(12) United States Patent
Fukasawa

(10) Patent No.: US 10,044,084 B2
(45) Date of Patent: Aug. 7, 2018

(54) LOW PASS FILTER

(71) Applicant: Murata Manufacturing Co., Ltd., Kyoto (JP)

(72) Inventor: Mikiko Fukasawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/866,794

(22) Filed: Jan. 10, 2018

(65) Prior Publication Data

US 2018/0198181 A1    Jul. 12, 2018

(30) Foreign Application Priority Data

Jan. 10, 2017   (JP) .............................. 2017-002013

(51) Int. Cl.

| H04B 1/10 | (2006.01) |
|---|---|
| H01P 1/202 | (2006.01) |
| H03F 3/24 | (2006.01) |
| H03H 7/01 | (2006.01) |
| H03H 7/12 | (2006.01) |
| H03F 3/195 | (2006.01) |
| H03F 1/32 | (2006.01) |
| H04B 1/04 | (2006.01) |
| H04B 1/18 | (2006.01) |
| H04W 72/08 | (2009.01) |

(52) U.S. Cl.
CPC ........... *H01P 1/202* (2013.01); *H03F 1/3247* (2013.01); *H03F 3/195* (2013.01); *H03F 3/24* (2013.01); *H03H 7/0115* (2013.01); *H03H 7/12* (2013.01); *H04B 1/0475* (2013.01); *H04B 1/18* (2013.01); *H04W 72/08* (2013.01); *H03F 2200/451* (2013.01)

(58) Field of Classification Search
CPC ........ H01P 1/202; H03F 1/3247; H03F 3/195; H03F 3/24; H03F 2200/451; H03H 7/0115; H03H 7/12; H03K 17/76; H04B 1/0475; H04B 1/18; H04B 1/30; H04W 72/08

See application file for complete search history.

(56) References Cited

U.S. PATENT DOCUMENTS

| 6,356,746 B1 * | 3/2002 | Katayama ................ H04B 1/30 455/161.3 |
|---|---|---|
| 2013/0250819 A1 * | 9/2013 | Khlat ....................... H04B 1/10 370/278 |

FOREIGN PATENT DOCUMENTS

| JP | H07-321509 A | 12/1995 |
|---|---|---|
| JP | 2000-59106 A | 2/2000 |
| JP | 2001-168681 A | 6/2001 |
| JP | 2005-348288 A | 12/2005 |
| JP | 2016-92699 A | 5/2016 |

* cited by examiner

*Primary Examiner* — David S Huang
(74) *Attorney, Agent, or Firm* — Pearne & Gordon LLP

(57) ABSTRACT

When a plurality of RF signals having different freque bands are output at the same time by carrier aggregation, a switch element allows parallel connection between two capacitance elements such that a low pass filter has a first cut-off frequency that is lower than the frequency of an intermodulation distortion signal generated by the carrier aggregation. When an RF signal of a frequency band is output, the switch element releases parallel connection between the two capacitance elements such that the low pass filter has a second cut-off frequency that is higher than the first cut-off frequency.

12 Claims, 10 Drawing Sheets

LOW PASS FILTER

This application claims priority from Japanese Patent Application No. 2017-002013 filed on Jan. 10, 2017. The content of this application is incorporated herein by reference in its entirety.

BACKGROUND

The present disclosure relates to a low pass filter. As a technique for improving the communication speed in mobile communication terminals, carrier aggregation has been known in which radio frequency (RF) signals are transmitted and received at the same time using a single communication line formed by collection of a plurality of component carriers (CC) having different frequency bands. According to Japanese Unexamined Patent Application Publication No. 2016-92699, it is reported that, based on uplink carrier aggregation, when a plurality of RF signals of different frequency bands are amplified by a single power amplifier, intermodulation distortion corresponding to distortion characteristics of the power amplifier occurs. An intermodulation distortion signal serves as a spurious component of an RF signal radiated from an antenna, and provides interference to communication in a frequency band to which a CC belongs or an adjacent frequency band. For example, when a signal in a band of about 800 MHz and a signal in a band of about 1.7 GHz are amplified at the same time, a five-order intermodulation distortion signal is generated in a band from about 1535 MHz to about 1615 MHz. As described above, in an operation based on carrier aggregation, generation of intermodulation distortion and harmonic distortion is a factor for a degradation in characteristics.

For example, as a method for reducing intermodulation distortion generated by uplink/downlink carrier aggregation, for example, a method for mounting a low pass filter for attenuating an intermodulation distortion signal at a transmission path for an RF signal is considered.

However, such a low pass filter has a drawback in that unnecessary insertion loss occurs in a transmission path for an RF signal when uplink/downlink carrier aggregation is not implemented.

BRIEF SUMMARY

Accordingly, the present disclosure solves the above drawback and to reduce insertion loss of a low pass filter.

According to embodiments of the present disclosure, a low pass filter that inputs and outputs an RF signal includes (i) a first switch element; (ii) a first capacitance element whose one end is connected to a signal line for the low pass filter and whose other end is connected to ground of the low pass filter; and (iii) a second capacitance element whose one end is connected to the signal line and whose other end is connected to the ground via the first switch element. When a plurality of RF signals having different frequency bands are output at the same time by carrier aggregation, the first switch element is turned on such that the low pass filter has a first cut-off frequency that is lower than a frequency of an intermodulation distortion signal generated by the carrier aggregation, thereby the first capacitance element and the second capacitance element being connected in parallel between the signal line and the ground. In contrast, when an RF signal of a frequency band is output, the first switch element is turned off such that the low pass filter has a second cut-off frequency that is higher than the first cut-off frequency, thereby parallel connection between the first capacitance element and the second capacitance element being released.

According to embodiments of the present disclosure, insertion loss of a low pass filter may be reduced.

Other features, elements, and characteristics of the present disclosure will become more apparent from the following detailed description of embodiments of the present disclosure with reference to the attached drawings.

DETAILED DESCRIPTION

Embodiments of the present disclosure will be described with reference to drawings. The same reference signs will represent the same circuit elements, and redundant explanation will be omitted. In each of the embodiments described below, a case where an uplink carrier aggregation operation is performed will be described as an example. However, the present disclosure may also be applied to a case where a downlink carrier aggregation operation is performed.

Figure 1:
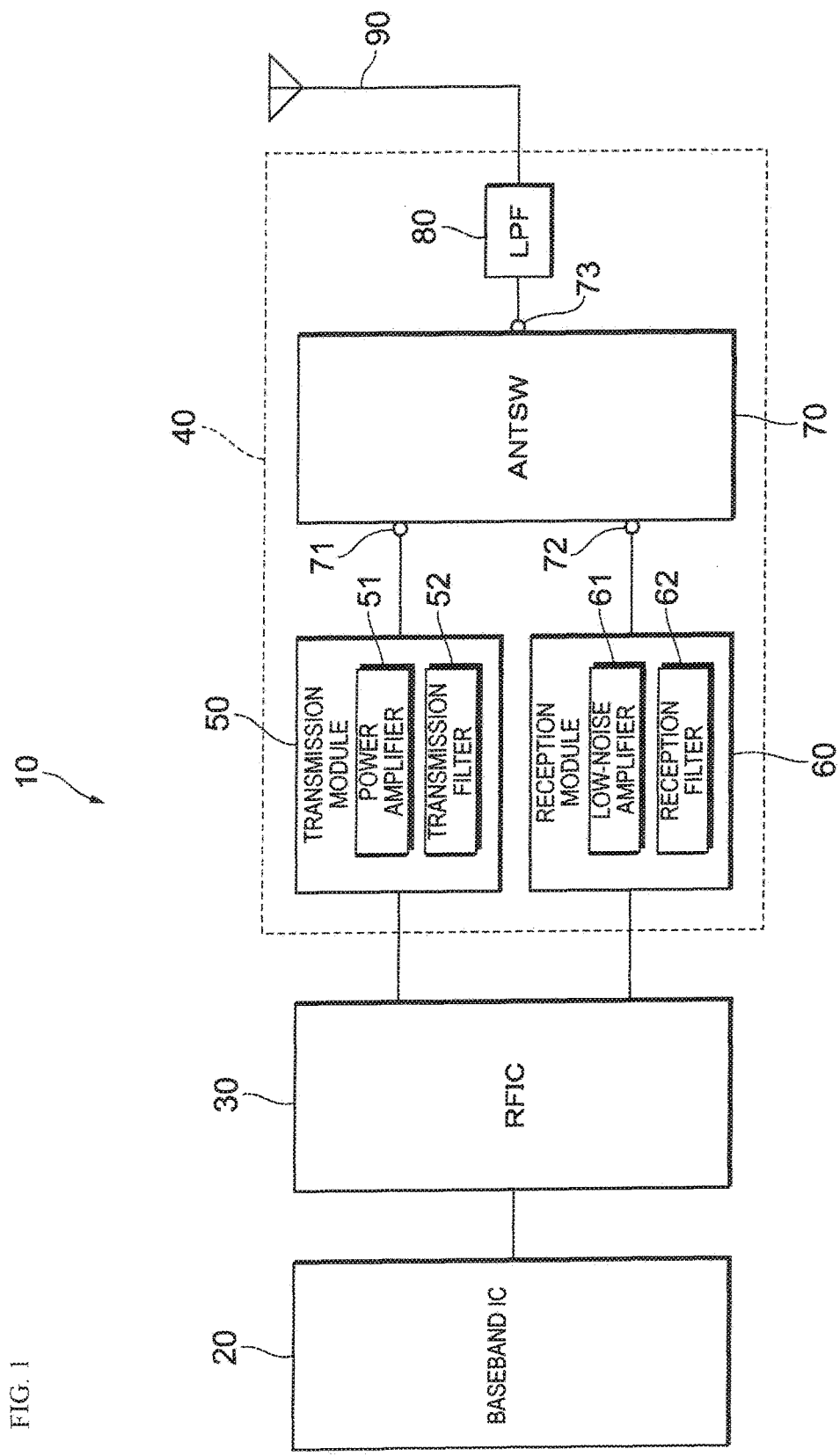
FIG. 1 is a block diagram illustrating a circuit configuration of a wireless communication circuit according to a first embodiment of the present disclosure.

FIG. 1 is a block diagram illustrating a circuit configuration of a wireless communication circuit 10 according to a first embodiment of the present disclosure. The wireless communication circuit 10 is a module, in a mobile communication apparatus such as a cellular phone, for transmitting and receiving RF signals to and from a base station. The wireless communication circuit 10 is also capable of, by carrier aggregation, transmitting and receiving a plurality of RF signals having different frequency bands at the same time. The wireless communication circuit 10 includes a baseband integrated circuit (IC) 20, a radio frequency integrated circuit (RFIC) 30, a high frequency module 40, and an antenna 90. The high frequency module 40 includes a transmission module 50, a reception module 60, an antenna switch (ANTSW) 70, and a low pass filter (LPF) 80.

The baseband IC 20 performs encoding and modulation of communication information in accordance with a predetermined communication method, and generates a baseband signal by digital signal processing. The RFIC 30 generates an RF signal, as a transmission signal, by modulating carrier waves in accordance with information superimposed on a baseband signal. The transmission module 50 includes a power amplifier 51 and a transmission filter 52, and performs filtering corresponding to a frequency band of a transmission signal and power amplification of the transmission signal. The power amplifier 51 includes one or more transistor elements.

The antenna switch 70 includes a node 71 connected to the transmission module 50, a node 72 connected to the reception module 60, and a node 73 connected to the antenna 90. The low pass filter 80 which inputs and outputs an RF signal output from the power amplifier 51 is mounted at a signal path between the antenna switch 70 and the antenna 90. The antenna switch 70 selectively establishes a signal path for a transmission signal between the nodes 71 and 73. Accordingly, the low pass filter 80 is connected to output of the power amplifier 51. When a plurality of RF signals having different frequency bands are output from the power amplifier 51 at the same time by carrier aggregation, the low pass filter 80 attenuates an intermodulation distortion signal generated by the carrier aggregation.

The antenna switch 70 selectively establishes a signal path for an RF signal, as a reception signal received from a base station via the antenna 90, between the nodes 72 and 73. Accordingly, the low pass filter 80 is connected to input of a low-noise amplifier 61. The reception module 60 includes the low-noise amplifier 61 and a reception filter 62, and performs filtering corresponding to a frequency band of a reception signal and low-noise amplification of the reception signal. The RFIC 30 converts a reception signal into a baseband signal. The baseband IC 20 demodulates and decodes a baseband signal, and extracts communication information.

Figure 2:
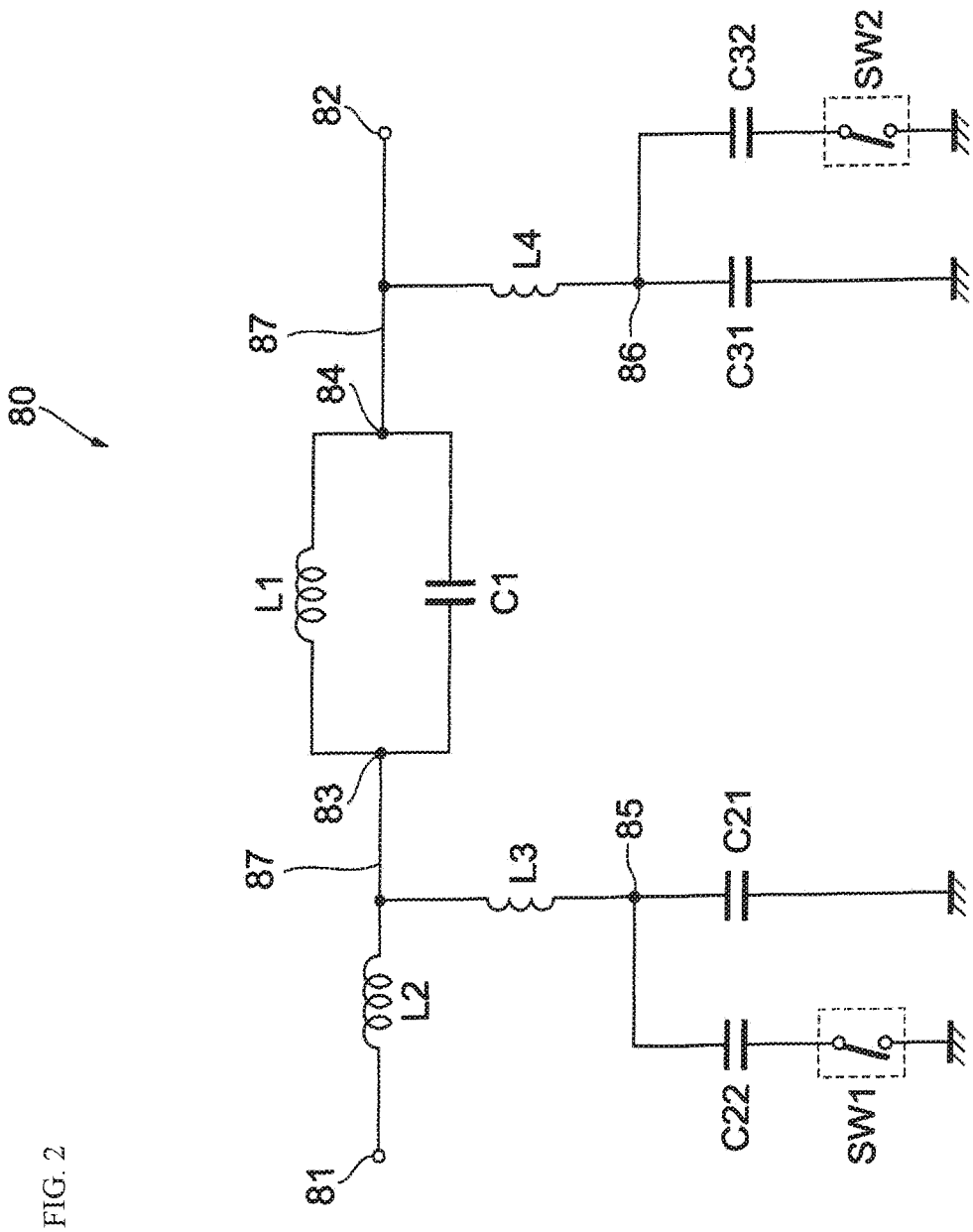
FIG. 2 is a circuit diagram illustrating an example of a circuit configuration of a low pass filter according to a first embodiment of the present disclosure.

FIG. 2 is a circuit diagram illustrating an example of a circuit configuration of the low pass filter 80 according to the first embodiment of the present disclosure. The low pass filter 80 attenuates a high frequency component of an RF signal input to an input/output node 81, and outputs the resultant signal from an input/output node 82. The input/output node 81 is connected to the node 73 of the antenna switch 70, and the input/output node 82 is connected to the antenna 90. A line connecting the input/output node 81 with the input/output node 82 is referred to as a signal line 87. The low pass filter 80 is the one obtained by partially changing a circuit of a known low pass filter having elliptic function characteristics, and includes a parallel resonance circuit including a capacitance element C1 and an inductor element L1. With this parallel resonance, sharp attenuation characteristics may be achieved near a cut-off frequency. The parallel resonance circuit is connected in series with the signal line 87. One of two nodes as points at which the capacitance element C1 and the inductor element L1 are connected in parallel is referred to as a node 83, and the other node is referred to as a node 84. An inductor element L2 is connected between the input/output node 81 and the node 83. An inductor element L3 and a capacitance element C21 are connected in series between the node 83 and the ground (that is, between the signal line 87 and the ground). As described above, one end of the capacitance element C21 is connected to the signal line 87, and the other end of the capacitance element C21 is connected to the ground. A point at which the inductor element L3 and the capacitance element C21 are connected is referred to as a node 85. A capacitance element C22 and a switch element SW1 are connected in series between the node 85 and the ground (that is, between the signal line 87 and the ground). As described above, one end of the capacitance element C22 is connected to the signal line 87, and the other end of the capacitance element C22 is connected to the ground via the switch element SW1. An inductor element L4 and a capacitance element C31 are connected in series between the node 84 and the ground (that is, between the signal line 87 and the ground). As described above, one end of the capacitance element C31 is connected to the signal line 87, and the other end of the capacitance element C31 is connected to the ground. A point at which the inductor element L4 and the capacitance element C31 are connected is referred to as a node 86. A capacitance element C32 and a switch element SW2 are connected in series between the node 86 and the ground (that is, between the signal line 87 and the ground). As described above, one end of the capacitance element C32 is connected to the signal line 87, and the other end of the capacitance element C32 is connected to the ground via the switch element SW2.

Each of the switch elements SW1 and SW2 is a semiconductor switch, such as a field effect transistor, which is called a single pole single throw (SPST) switch. When the switch element SW1 is turned on, the capacitance elements C21 and C22 are connected in parallel between the signal line 87 and the ground. In contrast, when the switch element SW1 is turned off, parallel connection between the capacitance elements C21 and C22 is released. As described above, the switch element SW1 selectively allows parallel connection between the capacitance elements C21 and C22. Hereinafter, in the case where the capacitance elements C21 and C22 are distinguished from each other, the capacitance element C21 will be referred to as a first capacitance element, and the capacitance element C22 will be referred to as a second capacitance element. Similarly, when the switch element SW2 is turned on, the capacitance elements C31 and C32 are connected in parallel between the signal line 87 and the ground. In contrast, when the switch element SW2 is turned off, parallel connection between the capacitance elements C31 and C32 is released. As described above, the switch element SW2 selectively allows parallel connection between the capacitance elements C31 and C32. Hereinafter, in the case where the capacitance elements C31 and C32 are distinguished from each other, the capacitance element C31 will be referred to as a first capacitance element, and the capacitance element C32 will be referred to as a second capacitance element. In accordance with ON/OFF operations of the switch elements SW1 and SW2, frequency characteristics (attenuation characteristics) of the low pass filter 80 may be changed. More particularly, when the switch elements SW1 and SW2 are turned on, the cut-off frequency of the low pass filter 80 may be reduced. In contrast, when the switch elements SW1 and SW2 are turned off, the cut-off frequency of the low pass filter 80 may be increased. The switch elements SW1 and SW2 perform ON/OFF operations in response to, for example, a control signal from the baseband IC 20 or the RFIC 30.

The low pass filter 80 is designed to operate in one operation mode selected from two operation modes. An operation mode that is selected when a plurality of RF signals having different frequency bands are output from the power amplifier 51 at the same time by carrier aggregation is referred to as a first operation mode. In the first operation mode, the switch elements SW1 and SW2 are in an ON state such that the low pass filter 80 has a cut-off frequency that is lower than the frequency of an intermodulation distortion signal generated by carrier aggregation. Accordingly, the low pass filter 80 may attenuate the intermodulation distortion signal. For the convenience of explanation, the cut-off frequency of the low pass filter 80 in the first operation mode is referred to as a first cut-off frequency. An operation mode that is selected when an RF signal of one frequency band is output from the power amplifier 51 (that is, uplink carrier aggregation is not performed) is referred to as a second operation mode. In the second operation mode, the switch elements SW1 and SW2 are in an OFF state such that the low pass filter 80 has a cut-off frequency that is higher than the first cut-off frequency. Accordingly, the pass band of the low pass filter 80 extends from a low frequency band to a wide region including a low frequency band and a high frequency band. Therefore, insertion loss by the low pass filter 80 occurring in an RF signal output from the power amplifier 51 may be reduced. In the second operation mode, the low pass filter 80 does not need to attenuate an intermodulation distortion signal generated by carrier aggregation. Therefore, it is desirable that the cut-off frequency of the low pass filter 80 is as high as possible. For the convenience of explanation, the cut-off frequency of the low pass filter 80 in the second operation mode is referred to as a second cut-off frequency.

When the switch elements SW1 and SW2 are in the ON state, the switch elements SW1 and SW2 behave as equivalent to resistance elements. When the switch elements SW1 and SW2 are in the OFF state, the switch elements SW1 and SW2 behave as equivalent to capacitance elements. In the light of the above, the first cut-off frequency of the low pass filter 80 is determined based on element values (capacitance values and inductance values) of the individual circuit elements (the capacitance elements C1, C21, C22, C31, and 32 and the inductor elements L1, L2, L3, and L4) forming the low pass filter 80 and ON resistances of the switch elements SW1 and SW2. Similarly, the second cut-off frequency of the low pass filter 80 is determined based on element values (capacitance values and inductance values) of the individual circuit elements (the capacitance elements C1, C21, C22, C31, and C32 and the inductor elements L1, L2, L3, and L4) forming the low pass filter 80 and OFF capacitances of the switch elements SW1 and SW2. An ON resistance represents a resistance value of a switch element in the ON state. An OFF capacitance represents a capacitance value of a switch element in the OFF state.

Figure 3:
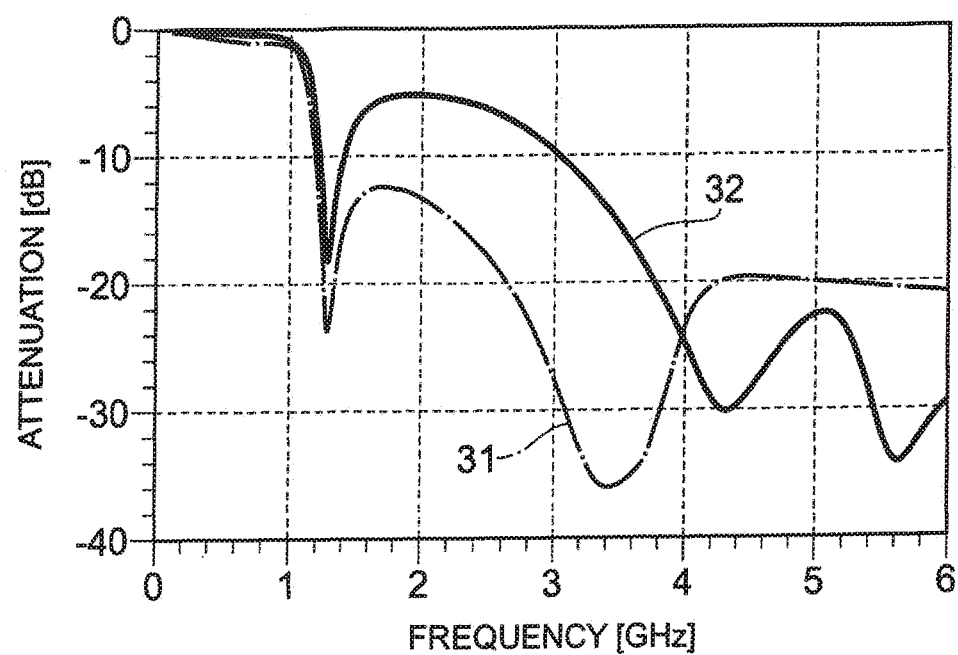
FIG. 3 illustrates simulation results representing frequency characteristics of the low pass filter according to the first embodiment of the present disclosure.

FIG. 3 illustrates simulation results representing frequency characteristics of the low pass filter 80. Reference numeral 31 represents frequency characteristics of the low pass filter 80 in the first operation mode. Reference sign 32 represents frequency characteristics of the low pass filter 80 in the second operation mode. As is clear from FIG. 3, when the operation mode of the low pass filter 80 is switched from the first operation mode to the second operation mode, attenuation characteristics becomes moderate, the pass band of the low pass filter 80 extends from a low frequency band to a wide region including a low frequency band and a high frequency band. Accordingly, in the second operation mode, insertion loss by the low pass filter 80 occurring in an RF signal output from the power amplifier 51 may be reduced.

As described above, with the low pass filter 80 according to the first embodiment, in accordance with ON/OFF operations of the switch elements SW1 and SW2, an intermodulation distortion signal may be attenuated in the first operation mode, and the insertion loss of the low pass filter 80 may be reduced in the second operation mode. Furthermore, by determining the first cut-off frequency of the low pass filter 80 based on the element values of the individual circuit elements forming the low pass filter 80 and the ON resistances of the switch elements SW1 and SW2, design accuracy may be increased. Similarly, by determining the second cut-off frequency of the low pass filter 80 based on the element values of the individual circuit elements forming the low pass filter 80 and the OFF capacitances of the switch elements SW1 and SW2, design accuracy may be increased.

The low pass filter 80 is not necessarily mounted at a signal path between the antenna switch 70 and the antenna 90. For example, the low pass filter 80 may be incorporated inside the antenna switch 70. Alternatively, the low pass filter 80 may be incorporated inside a front-end module of the wireless communication circuit 10. For example, a front-end module is a module implemented by the antenna switch 70, the transmission filter 52, and the reception filter 62.

Furthermore, the low pass filter 80 does not necessarily have elliptic function characteristics. For example, the low pass filter 80 may have Chebyshev characteristics, Butterworth characteristics, Bessel characteristics, or the like.

Figure 4:
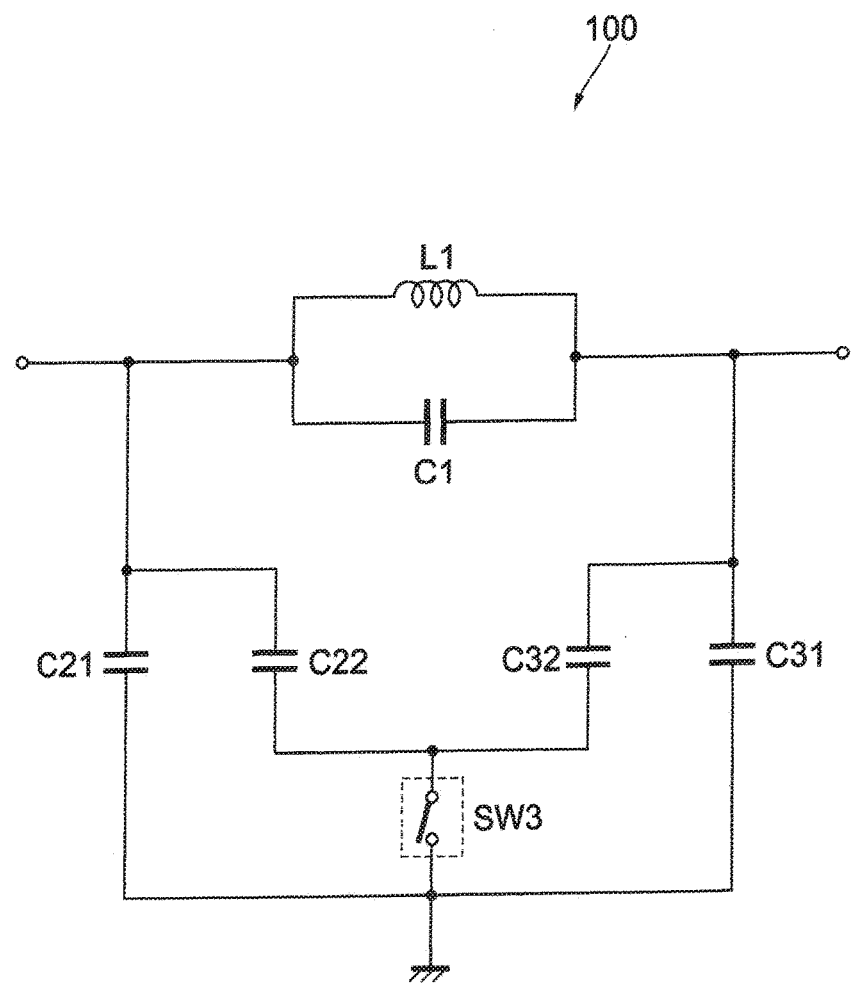
FIG. 4 is a circuit diagram illustrating an example of a circuit configuration of a low pass filter according to a second embodiment of the present disclosure.

Next, a circuit configuration of a low pass filter 100 according to a second embodiment of the present disclosure will be described with reference to FIG. 4, focusing on differences from the low pass filter 80 according to the first embodiment. The low pass filter 100 has a circuit configuration in which the switch elements SW1 and SW2 of the low pass filter 80 is replaced by a switch element SW3 and the inductor elements L2, L3, and L4 are eliminated from the low pass filter 80. In the second embodiment, the switch element SW3 is a semiconductor switch, such as a field effect transistor, which is called an SPST switch, and performs ON/OFF operations in response to, for example, a control signal from the baseband IC 20 or the RFIC 30.

In the first operation mode, the switch element SW3 is in an ON state such that the capacitance elements C21 and C22 are connected in parallel and the capacitance elements C31 and C32 are connected in parallel. Accordingly, the low pass filter 100 has a first cut-off frequency that is lower than the frequency of an intermodulation distortion signal generated by carrier aggregation. Thus, the low pass filter 100 may attenuate the intermodulation distortion signal. In the second operation mode, the switch element SW3 is in an OFF state such that parallel connection between the capacitance elements C21 and C22 is released and parallel connection between the capacitance elements C31 and C32 is released. Accordingly, the low pass filter 100 has a second cut-off frequency that is higher than the first cut-off frequency. The pass band of the low pass filter 100 extends from a low frequency band to a wide region including a low frequency band and a high frequency band, and therefore, may reduce insertion loss by the low pass filter 100 occurring in an RF signal output from the power amplifier 51.

Figure 5:
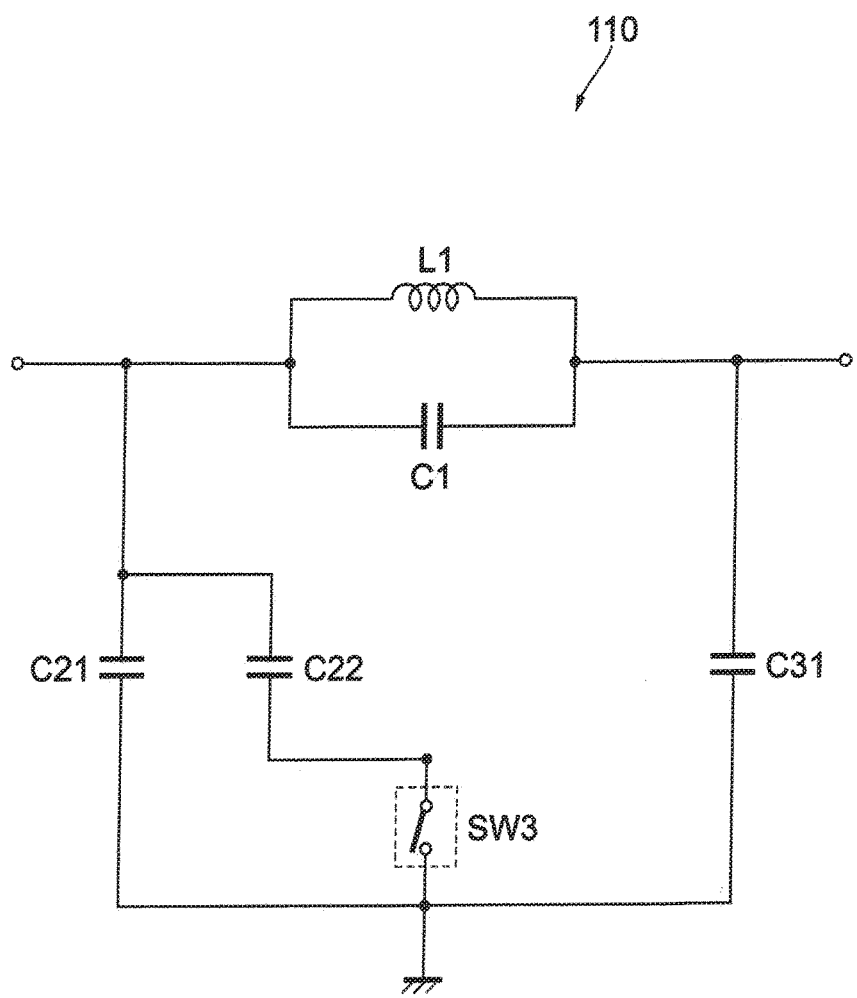
FIG. 5 is a circuit diagram illustrating an example of a circuit configuration of a low pass filter according to a third embodiment of the present disclosure.

Next, a circuit configuration of a low pass filter 110 according to a third embodiment of the present disclosure will be described with reference to FIG. 5, focusing on differences from the low pass filter 100 according to the second embodiment. The low pass filter 110 has a circuit configuration in which the capacitance element C32 is eliminated from the low pass filter 100. Operation of the low pass filter 110 and operation effects of the low pass filter 110 are similar to those of the low pass filter 100.

Figure 6:
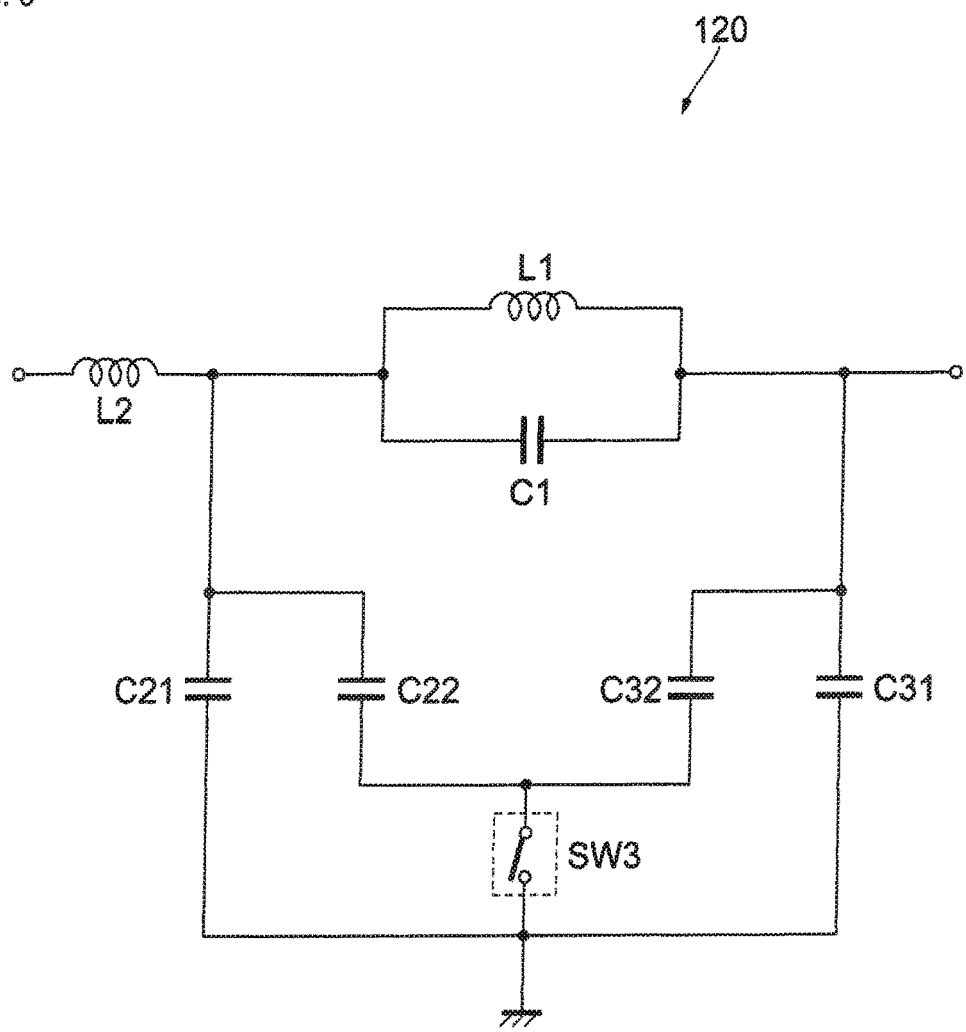
FIG. 6 is a circuit diagram illustrating an example of a circuit configuration of a low pass filter according to a fourth embodiment of the present disclosure.

Next, a circuit configuration of a low pass filter 120 according to a fourth embodiment of the present disclosure will be described with reference to FIG. 6, focusing on differences from the low pass filter 100 according to the second embodiment. The low pass filter 120 has a circuit configuration in which the inductor element L2 functioning as a matching circuit is added to the low pass filter 100. Operation of the low pass filter 120 and operation effects of the low pass filter 120 are similar to those of the low pass filter 100.

Figure 7:
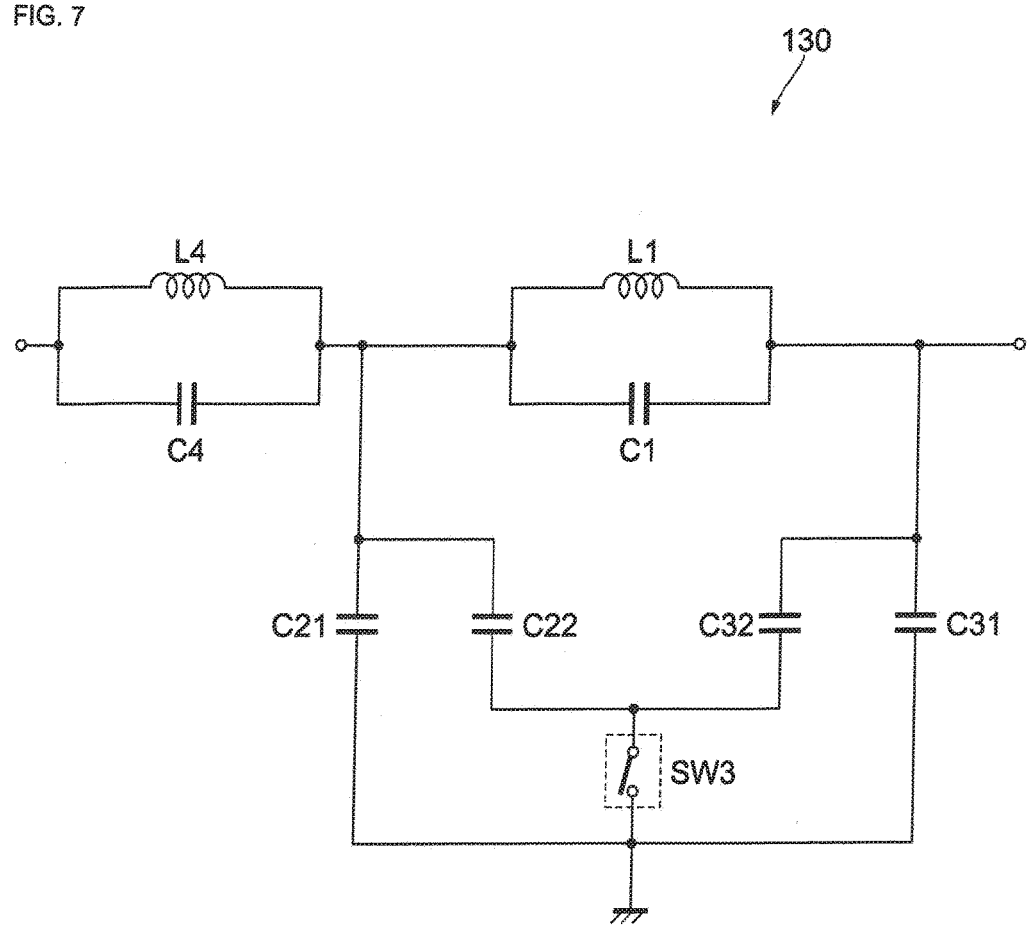
FIG. 7 is a circuit diagram illustrating an example of a circuit configuration of a low pass filter according to a fifth embodiment of the present disclosure.

Next, a circuit configuration of a low pass filter 130 according to a fifth embodiment of the present disclosure will be described with reference to FIG. 7, focusing on differences from the low pass filter 100 according to the second embodiment. The low pass filter 130 has a circuit configuration in which a parallel resonance circuit including a capacitance element C4 and the inductor element L4 is added to the low pass filter 100. Operation of the low pass filter 130 and operation effects of the low pass filter 130 are similar to those of the low pass filter 100.

Figure 8:
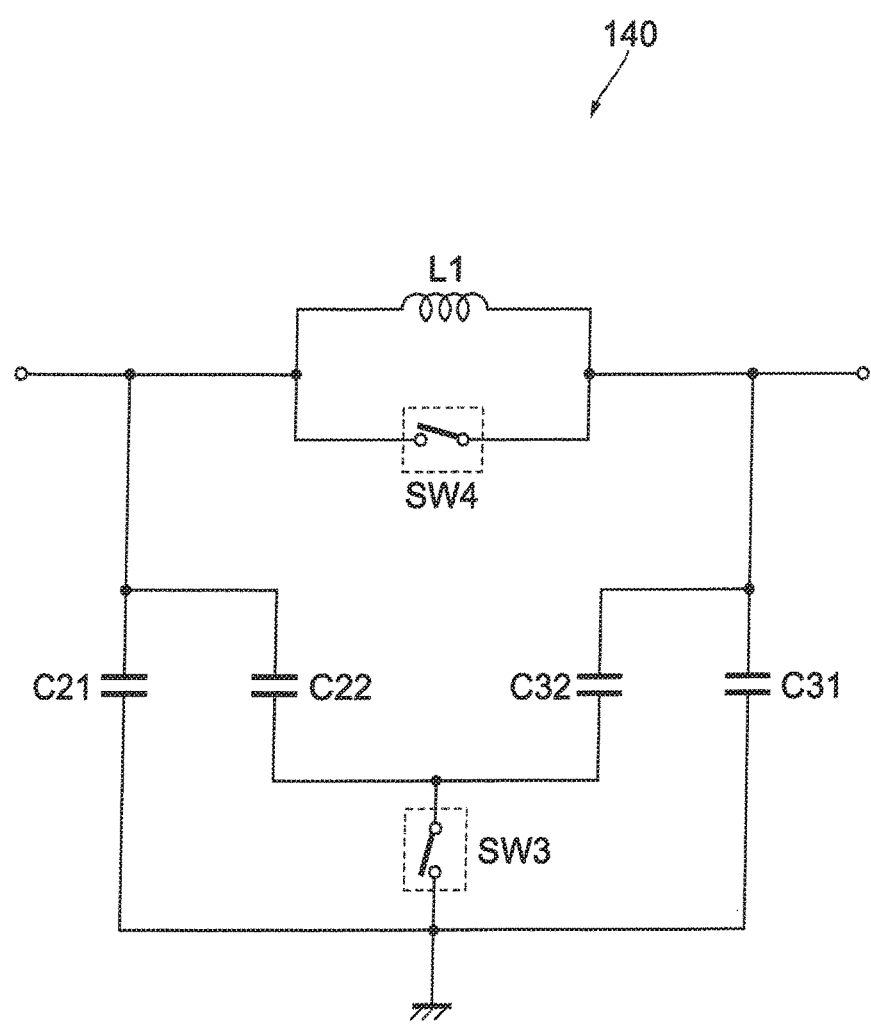
FIG. 8 is a circuit diagram illustrating an example of a circuit configuration of a low pass filter according to a sixth embodiment of the present disclosure.

Next, a circuit configuration of a low pass filter 140 according to a sixth embodiment of the present disclosure will be described with reference to FIG. 8, focusing on differences from the low pass filter 100 according to the second embodiment. The low pass filter 140 has a circuit configuration in which the capacitance element C1 of the low pass filter 100 is replaced by a switch element SW4. The switch element SW4 is a semiconductor switch, such as a field effect transistor, which is called an SPST switch, and performs ON/OFF operations in response to, for example, a control signal from the baseband IC 20 or the RFIC 30. The switch element SW4 is connected in parallel with the inductor element L1. The inductor element L1 is connected in series with a signal line for the low pass filter 140.

In the first operation mode, the switch element SW3 is in an ON state and the switch element SW4 is in an OFF state such that the low pass filter 140 has a first cut-off frequency that is lower than the frequency of an intermodulation distortion signal generated by carrier aggregation. When the switch element SW4 is in the OFF state, the switch element SW4 behaves as equivalent to a capacitance element, and the switch element SW4 and the inductor element L1 form a parallel resonance circuit. With sharp attenuation characteristics near the first cut-off frequency by parallel resonance, the low pass filter 140 may attenuate an intermodulation distortion signal. In the second operation mode, the switch element SW3 is in the OFF state and the switch element SW4 is in the ON state such that the low pass filter 140 has a second cut-off frequency that is higher than the first cut-off frequency. When the switch element SW4 is in the ON state, the switch element SW4 behaves as equivalent to a resistance element, and the switch element SW4 and the inductor element L1 do not form a parallel resonance circuit. Accordingly, the attenuation characteristics of the low pass filter 140 become moderate, and the pass band of the low pass filter 140 extends from a low frequency band to a wide region including a low frequency band and a high frequency band. Therefore, insertion loss by the low pass filter 140 occurring in an RF signal output from the power amplifier 51 may be reduced.

The first cut-off frequency of the low pass filter 140 is determined based on element values (capacitance values and inductance values) of the individual circuit elements (the capacitance elements C21, C22, C31, and C32 and the inductor element L1) forming the low pass filter 140, an ON resistance of the switch element SW3, and an OFF capacitance of the switch element SW4. The second cut-off frequency of the low pass filter 140 is determined based on element values (capacitance values and inductor values) of the individual circuit elements (the capacitance elements C21, C22, C31, and C32 and the inductor element L1) forming the low pass filter 140, an OFF capacitance of the switch element SW3, and an ON resistance of the switch element SW4.

As described above, with the low pass filter 140 according to the sixth embodiment, in accordance with ON/OFF operations of the switch elements SW3 and SW4, an intermodulation distortion signal may be attenuated in the first operation mode, and the insertion loss of the low pass filter 140 may be reduced in the second operation mode. Furthermore, by determining the first cut-off frequency of the low pass filter 140 based on the element values of the individual circuit elements forming the low pass filter 140, the ON resistance of the switch element SW3, and the OFF capacitance of the switch element SW4, design accuracy may be increased. Similarly, by determining the second cut-off frequency of the low pass filter 140 based on the element values of the individual circuit elements forming the low pass filter 140, the OFF capacitance of the switch element SW3, and the ON resistance of the switch element SW4, design accuracy may be increased.

A function of the switch element SW4 is different from functions of the switch elements SW1, SW2, and SW3. Therefore, the switch elements SW1, SW2, and SW3 may be referred to as first switch elements, and the switch element SW4 may be referred to as a second switch element.

Figure 9:
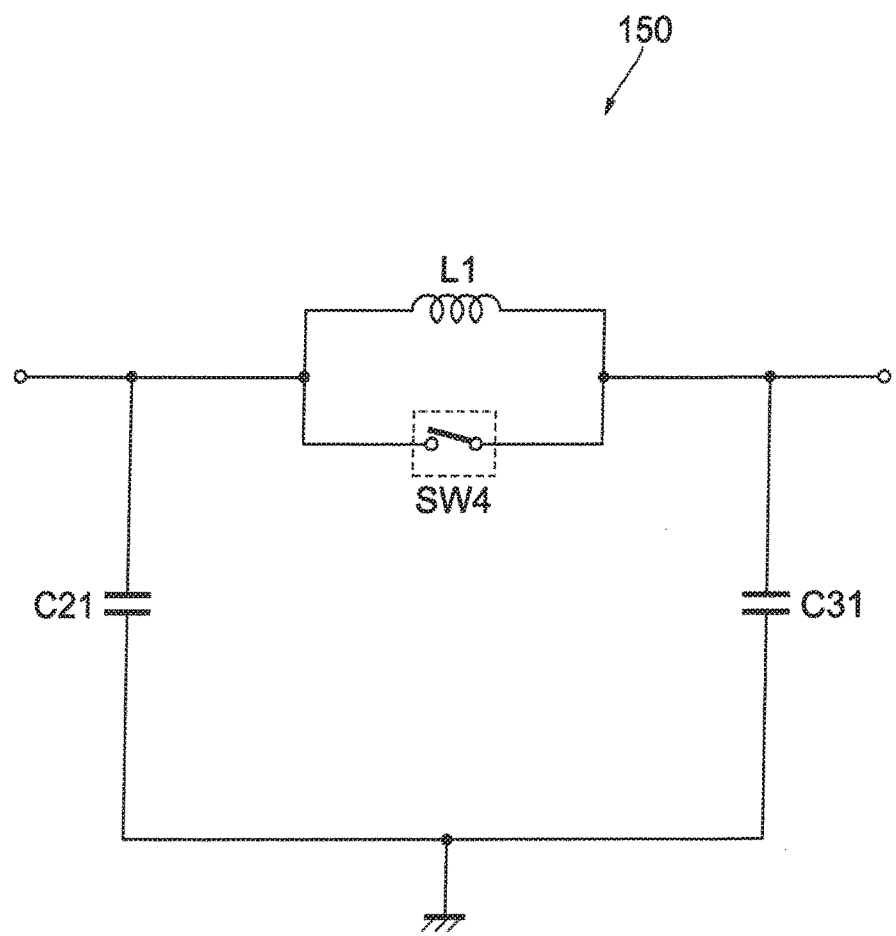
FIG. 9 is a circuit diagram illustrating an example of a circuit configuration of a low pass filter according to a reference example.

Next, a circuit configuration of a low pass filter 150 according to a reference example will be described with reference to FIG. 9, focusing on differences from the low pass filter 140 according to the sixth embodiment. The low pass filter 150 has a circuit configuration in which the capacitance elements C22 and C32 and the switch element SW3 are eliminated from the low pass filter 140.

In the first operation mode, the switch element SW4 is in an OFF state such that the low pass filter 150 has a first cut-off frequency that is lower than the frequency of an intermodulation distortion signal generated by carrier aggregation. When the switch element SW4 is in the OFF state, the switch element SW4 behaves as equivalent to a capacitance element, and the switch element SW4 and the inductor element L1 form a parallel resonance circuit. With sharp attenuation characteristics near the first cut-off frequency by parallel resonance, the low pass filter 150 may attenuate an intermodulation distortion signal. In the second operation mode, the switch element SW4 is in an ON state such that the low pass filter 150 has a second cut-off frequency that is higher than the first cut-off frequency. When the switch element SW4 is in the ON state, the switch element SW4 behaves as equivalent to a resistance element, and the switch element SW4 and the inductor element L1 do not form a parallel resonance circuit. Accordingly, attenuation characteristics of the low pass filter 140 become moderate, and the pass band of the low pass filter 140 extends from a low frequency band to a wide region including a low frequency band and a high frequency band. Therefore, insertion loss by the low pass filter 150 occurring in an RF signal output from the power amplifier 51 may be reduced.

The first cut-off frequency of the low pass filter 150 is determined based on element values (capacitance values and inductance values) of the individual circuit elements (the capacitance elements C21 and C31 and the inductor element L1) forming the low pass filter 140 and an OFF capacitance of the switch element SW4. The second cut-off frequency of the low pass filter 150 is determined based on the element values (capacitance values and inductance values) of the individual circuit elements (the capacitance elements C21 and C31 and the inductor element L1) forming the low pass filter 150 and an ON resistance of the switch element SW4.

Figure 10:
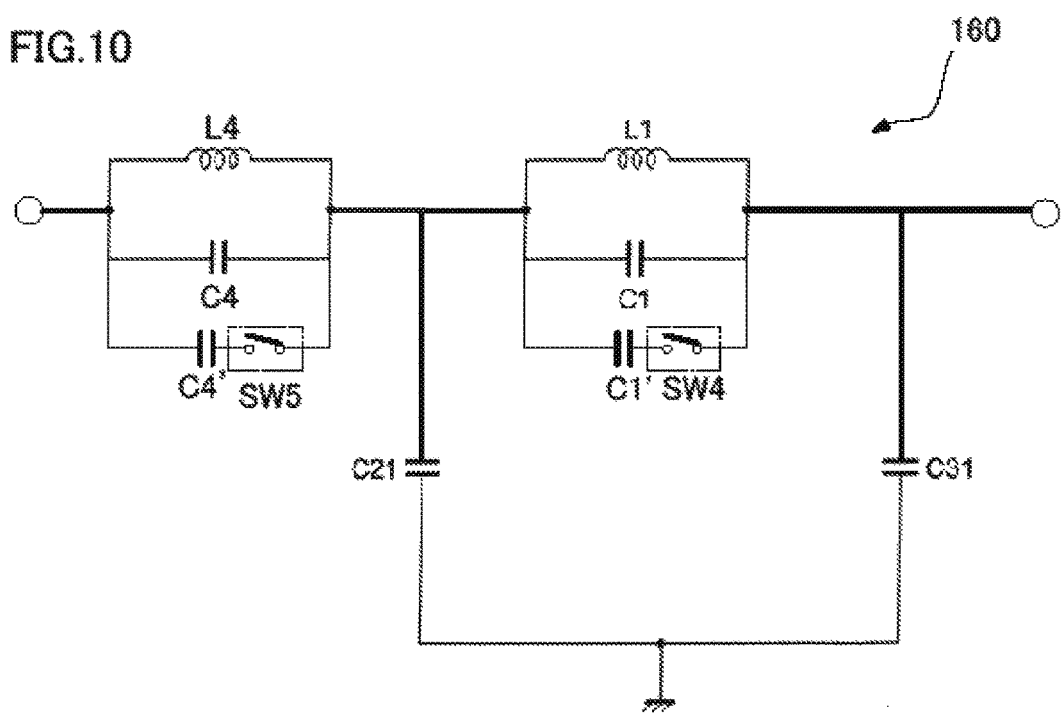
FIG. 10 is a circuit diagram illustrating an example of a circuit configuration of a low pass filter according to a seventh embodiment of the present disclosure.

Next, a circuit configuration of a low pass filter 160 according to a seventh embodiment of the present disclosure will be described with reference to FIG. 10, focusing on differences from the low pass filter 150. The low pass filter 160 has additional lumped elements based on the low pass filter 150. The additional lumped elements are capacitor element C1', C4 and C4' and switch element SW4 and SW5. Each switch element SW4, SW5 is a semiconductor switch, such as a field effect transistor, which is called an SPST switch, and performs ON/OFF operations in response to, for example, a control signal from the baseband IC 20 or the RFIC 30. The switch element SW4 and the capacitor element C1' are connected to each other in series, and together in parallel with the inductor element L1 and the capacitor element C1. The inductor element L1 and the capacitor element C1 are connected in series with a signal line for the low pass filter 160. The switch element SW5 and the capacitor element C4' are connected to each other in series, and together in parallel with the inductor element L4 and the capacitor element C4. The inductor element L4 and the capacitor element C4 are connected in series with a signal line for the low pass filter 160.

It is noted that the foregoing embodiments are provided to facilitate understanding of the present invention and are not intended to limit the scope of the present invention. Changes and improvements may be made to the present invention without departing from the scope of the present invention, and the present invention also includes equivalents thereof. That is, design changes may be made to the embodiments in an appropriate manner by those skilled in the art, and such embodiments are also within the scope of the present invention as long as they have features of the present invention. The individual circuit elements included in the embodiments and the arrangements thereof are not limited to those described above as examples, and they may be changed in an appropriate manner. For example, a state in which "a circuit element A is connected to a circuit element B" represents the case where a signal path may be selectively established via a circuit element C (for example, a switch element) between the circuit element A and the circuit element B as well as the case where the circuit element A is directly connected to the circuit element B. In addition, the circuit elements included in the embodiments can be combined with each other as long as it is technically possible, and such combination is also within the scope of the present invention as long as the combination has features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A low pass filter that receives and outputs at least one radio frequency (RF) signal, comprising:
   a first switch;
   a first capacitance element having a first end connected to a signal line of the low pass filter and having a second end connected to ground; and
   a second capacitance element having a first end connected to the signal line and having a second end connected to ground via the first switch,
   wherein when a plurality of RF signals having different frequency bands are output at the same time by carrier aggregation, the first switch is closed such that the low pass filter has a first cut-off frequency that is lower than a frequency of an intermodulation distortion signal generated by the carrier aggregation, and such that the first capacitance element and the second capacitance element are connected in parallel between the signal line and ground, and
   wherein when a single RF signal is output, the first switch is open such that the low pass filter has a second cut-off frequency that is higher than the first cut-off frequency, and such that the second capacitance element is not connected to ground.

2. The low pass filter according to claim 1, further comprising:
   an inductor element that is connected in the signal line; and
   a second switch that is connected in parallel with the inductor element,
   wherein when a plurality of RF signals having different frequency bands are output at the same time by the carrier aggregation, the second switch is open such that the low pass filter has the first cut-off frequency, and
   wherein when a single RF signal of a frequency band is output, the second switch is closed such that the low pass filter has the second cut-off frequency.

3. The low pass filter according to claim 2,
   wherein the first cut-off frequency is based on values of the first and second capacitance elements, the inductor element, a resistance of the first switch when closed, and a capacitance of the second switch when open, and
   wherein the second cut-off frequency is based on values of the first and second capacitance elements, the inductor element, a capacitance of the first switch when open, and a resistance of the second switch when closed.

4. The low pass filter according to claim 3, wherein the low pass filter is connected to an output of a power amplifier or to an input of a low-noise amplifier.

5. The low pass filter according to claim 2, wherein the low pass filter is connected to an output of a power amplifier or to an input of a low-noise amplifier.

6. The low pass filter according to claim 1,
   wherein the first cut-off frequency is based on values of the first and second capacitance elements and a resistance of the first switch when closed, and
   wherein the second cut-off frequency is based on values of the first and second capacitance elements and a capacitance of the first switch when open.

7. The low pass filter according to claim 6, wherein the low pass filter is connected to an output of a power amplifier or to an input of a low-noise amplifier.

8. The low pass filter according to claim 1, wherein the low pass filter is connected to an output of a power amplifier or to an input of a low-noise amplifier.

9. The low pass filter according to claim 1, further comprising a first parallel connection of an inductor element and a capacitance element, the first parallel connection being in the signal line.

10. The low pass filter according to claim 9, further comprising an inductor element connected in the signal line in series with the first parallel connection, wherein the first end of the first capacitance element and the first end of the second capacitance element are connected to the signal line at a node between the inductor element and the first parallel connection.

11. The low pass filter according to claim 9, further comprising a second parallel connection of an inductor element and a capacitance element, the second parallel connection being in the signal line in series with the first parallel connection, wherein the first end of the first capacitance element and the first end of the second capacitance element are connected to the signal line at a node between the first parallel connection and the second parallel connection.

12. The low pass filter according to claim 1, wherein the first end of the first capacitance element and the first end of the second capacitance element are connected to each other at a node, and the low pass filter further comprises an inductor element connected between the signal line and the node.

\* \* \* \* \*